(12) United States Patent
Tsubota et al.

(10) Patent No.: US 6,655,901 B2
(45) Date of Patent: Dec. 2, 2003

(54) THREE-DIMENSIONALLY MOVABLE TRANSFER ROBOT

(75) Inventors: Ryusuke Tsubota, Sakai (JP); Kohta Hoshijima, Amagasaki (JP)

(73) Assignee: Daihen Corporation, Osaka (JP)

( * ) Notice: Subject to any disclaimer, the term of this patent is extended or adjusted under 35 U.S.C. 154(b) by 69 days.

(21) Appl. No.: 10/012,737

(22) Filed: Nov. 5, 2001

(65) Prior Publication Data

US 2002/0057955 A1 May 16, 2002

(30) Foreign Application Priority Data

Nov. 14, 2000 (JP) ........................................ 2000-346674
Jun. 5, 2001 (JP) ........................................ 2001-169995

(51) Int. Cl.[7] ................................................ B25J 18/04
(52) U.S. Cl. ................................ 414/744.5; 414/744.3; 901/15
(58) Field of Search ........................ 414/416.01, 416.03, 414/416.08, 744.5, 744.3; 907/15

(56) References Cited

U.S. PATENT DOCUMENTS 6,297,611 B1 * 10/2001 Todorov et al. .......... 901/15 X

FOREIGN PATENT DOCUMENTS

JP 11-238779 8/1999

* cited by examiner

Primary Examiner—Donald W. Underwood
(74) Attorney, Agent, or Firm—Merchant & Gould P.C.

(57) ABSTRACT

A transfer robot includes a machine base, at least one hand for holding a workpiece, a hand moving mechanism for moving the hand horizontally reciprocally at least in an X direction, a first arm pivotally connected to the machine base for rotation about an axis extending in the X direction. The robot further includes an intermediate arm pivotally connected to the first arm for rotation about another axis extending in the X direction, a second arm pivotally connected to the intermediate arm for rotation about a further axis extending in the X direction. The second arm is also connected to the hand moving mechanism which is rotatable about a still another axis extending in the X direction. A driving mechanism is provided for rotating the first arm, the second arm, the intermediate arm and the hand moving mechanism about the respective axes.

9 Claims, 11 Drawing Sheets

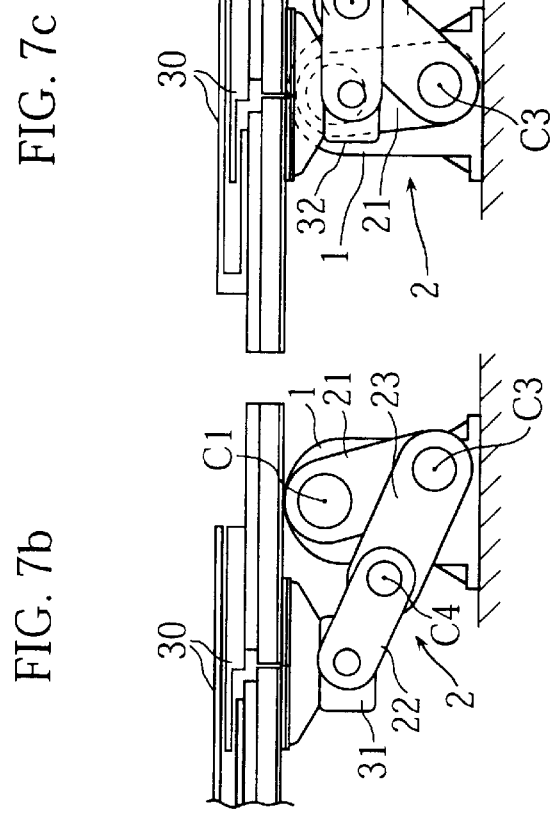
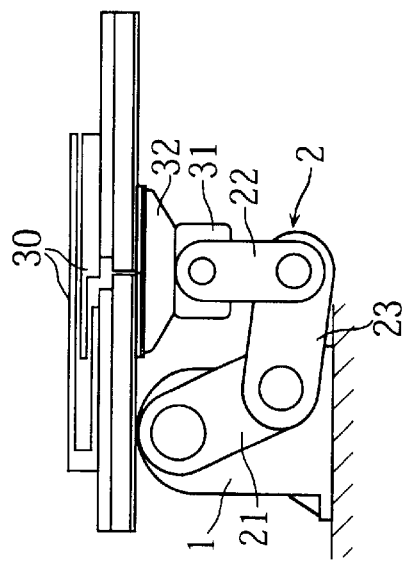

THREE-DIMENSIONALLY MOVABLE TRANSFER ROBOT

BACKGROUND OF THE INVENTION

1. Field of the Invention

The present invention relates to a transfer robot used for semiconductor manufacturing equipment, liquid crystal display manufacturing equipment and the like. More particularly, the present invention relates to a three-dimensionally movable transfer robot for transferring workpieces such as wafers between a wafer processing apparatus and a wafer stocker (which is located outside the processing apparatus) for example.

2. Description of the Related Art

As shown in FIG. 11, in manufacturing liquid crystal panels for example, a transfer robot (not shown) is used for taking out a plurality of substrates 7 stored in a stocker 62 one by one for placement in a desired processing chamber or for returning the processed substrates 7 into the stocker 62. The stocker 62 may be in the form of a cabinet including an opposite pair of side walls 62a. Each of the side walls 62a may be inwardly formed with a plural pairs of slots 62b for receiving the opposite side edges of the respective substrates 7 inserted into the stocker.

FIGS. 12 and 13 of the accompanying drawings illustrate two types of prior art transfer robots disclosed in JP-A-11-238779 for example. Specifically, FIG. 12 illustrates a first type of prior art transfer robot R1 which includes a hand 80, a hand moving mechanism 8 for moving the hand 80 in an X direction (not shown) which extends horizontally, and a link mechanism 9 for moving the entire hand moving mechanism 8. The link mechanism 9 includes a machine base 90, a first arm 91 having a base end and a free end, a second arm 92 also having a base end and a free end, a first connecting portion 93a, a second connecting portion 93b, and a third connecting portion 93c. The first arm 91 is rotatably connected at the base end to the machine base 90 via the first connecting portion 93a and connected at the free end to the base end of the second arm 92 via the second connecting portion 93b. The free end of the second arm 92 is rotatably connected to an intermediate base member 81 of the hand moving mechanism 8 via the third connecting portion 93c.

In the above-described transfer robot R1, the entire hand moving mechanism 8 is movable in both the Z direction (vertically) and the Y direction (extending horizontally but perpendicular to the X direction) by the rotation of the first and the second arms 91, 92 of the link mechanism 9. Moreover, by controlling the relative angle between the second arm 92 and the intermediate base member 81 in accordance with the inclination of the second arm 92, it is possible to constantly keep the posture of the hand moving mechanism 8 horizontal.

FIG. 13 illustrates a second type of transfer robot R2. The transfer robot R2 has a structure which is basically identical to that of the above-described transfer robot R1. Thus, the portions which are identical or similar to those of the transfer robot R1 are designated by the same reference signs as those used for the transfer robot shown in FIG. 12. The transfer robot R2 differs from the transfer robot R1 of FIG. 12 in that the first arm 91, which has a base end 91a and a free end 91b, is so rotatable as to allow the free end 91b to pass under the first connecting portion 93a. As compared with the transfer robot R1, the transfer robot R2 is suitable for transferring workpieces at a lower position, because the hand moving mechanism 8 is capable of horizontally moving at a lower position.

However, the above-described transfer robot R2 also has the following drawbacks.

A transfer robot needs to be capable of moving a hand horizontally and vertically along a straight line in as wide an area as possible while having a simple structure. However, the link mechanism 9 of the transfer robot R2 is a so-called two-arm type mechanism which provides the hand with only a relatively narrow movable range in the Y direction and the Z direction. Specifically, since the length of the first arm 91 needs to be smaller than a distance between a floor surface and the connecting portion 93a, it is not possible to make the first arm 91 longer beyond a certain limit so that the maximum height of the hand 80 cannot be increased. If the length of the second arm 92 is increased for solving the above-described problem, it becomes difficult to move the hand 80 horizontally at a lower position, though the maximum height of the hand 80 increases.

SUMMARY OF THE INVENTION

It is therefore an object of the present invention to provide a transfer robot which is capable of properly transferring workpieces linearly in a wide range.

Another object of the present invention is to provide a robotic transfer system incorporating such a robot.

In accordance with a first aspect of the present invention, there is provided a transfer robot which comprises a machine base, at least one hand for holding a workpiece, a hand moving mechanism for moving the hand horizontally reciprocally at least in an X direction, a first arm, a second arm, and a driving mechanism. The first arm has a base end and a free end. The base end of the first arm is connected to the machine base via a first connecting portion having an axis extending in the X direction, and the first arm is rotatable about the axis of the first connecting portion for allowing the free end to pass under the first connecting portion. The second arm also has a base end and a free end. The free end of the second arm is connected to the hand moving mechanism via a second connecting portion having an axis extending in the X direction. The driving mechanism causes the first arm to rotate about the axis of the first connecting portion while also rotating the hand moving mechanism about the axis of the second connecting portion. The transfer robot further includes an intermediate arm mechanism connected to the free end of the first arm via a third connecting portion having an axis extending in the X direction. The intermediate arm mechanism is also connected to the base end of the second arm via a fourth connecting portion having an axis extending in the X direction. The driving mechanism causes the intermediate arm mechanism to rotate about the axis of the third connecting portion while also causing the second arm to rotate about the axis of the fourth connecting portion.

According to the present invention, the link mechanism for moving the hand moving mechanism of the transfer robot includes a intermediate arm mechanism in addition to the first and the second arms. Therefore, by appropriately rotating the intermediate arm mechanism in addition to the first and the second arms, it is possible to make a movable range of the hand moving mechanism in the horizontal and the vertical directions larger than that of the prior art transfer robot which utilizes a two-arm type link mechanism. Further, the free end of the first arm can pass under the first connecting portion while keeping the posture of the intermediate arm mechanism generally horizontal. Therefore, the existence of the intermediate arm mechanism does not undesirably increases the height of the free end of the second arm. Thus, the hand moving mechanism can move horizontally at a relatively low position.

On the other hand, it is also possible to increase the maximum height of the hand moving mechanism by extending the intermediate arm mechanism generally vertically together with the first and the second arms. Moreover, it is also possible to increase the stroke of horizontal movement of the hand moving mechanism. Therefore, the transfer robot according to the present invention is useful in the case where the hand moving mechanism is required to move horizontally and vertically in a wide range. Further, according to the present invention, a size reduction of the transfer robot can be realized by increasing the movable range of the hand moving mechanism.

In one embodiment of the present invention, the intermediate arm mechanism includes only a single intermediate arm having a base end connected to the free end of the first arm via the third connecting portion. The single intermediate arm also has a free end connected to the base end of the second arm via the fourth connecting portion. The transfer robot according to claim 1, wherein each of the intermediate arm and the second arm is no greater in length than the first arm, the intermediate arm and the second arm providing a combined length which is greater than the length of the first arm.

Each of the intermediate arm and the second arm is no greater in length than the first arm, but the intermediate arm and the second arm provide a combined length which is greater than the length of the first arm. With this structure, when the first arm is so rotated as to lower the free end thereof while the intermediate arm and the second arm are extended upward relative to the free end of the first arm, the free end of the second arm can be located lower than the first connecting portion. Therefore, this structure is advantageous in moving the hand in the Y direction (which is generally horizontal, and perpendicular to the X direction) at a low position.

Alternatively, at least either one of the intermediate arm and the second arm is greater in length than the first arm. With this structure, it is possible to further increase the movable range of the hand in the Y direction as well as the maximum height of the hand in the Z direction (vertical).

Preferably, the hand may hold the work piece by carrying the workpiece thereon, by clamping the workpiece, by sucking the workpiece under vacuum, or by magnetically attracting the workpiece. However, the hand may be provided with any other means for holding the workpiece according to the present invention.

Preferably, the hand moving mechanism may be designed to move a plurality of hands at least in the X direction independently of each other. With this structure, a plurality of workpieces can be handled by the hands so that the efficiency in transferring the workpieces is enhanced. In this case, the hands may differ from each other in height, so that they do not interfere with each other.

Preferably, the hand moving mechanism may be rotatable about a vertical axis for making the hand movable reciprocally in a generally horizontal plane in any direction other than the X direction. With this structure, it is possible to transfer the workpiece in various ways.

Preferably, the driving mechanism may comprise a first motor for rotating the first arm about the axis of the first connecting portion, a second motor for rotating the hand moving mechanism about the axis of the second connecting portion, a third motor for rotating the intermediate arm about the axis of the third connecting portion, and a fourth motor for rotating the second arm about the axis of the fourth connecting portion. According to this structure, it is possible to increase the freedom of movement of the transfer robot.

According to a second aspect of the present invention, a robotic transfer system comprises a plurality of stockers aligned in a Y direction for storing a plurality of workpieces in multiple stages, and a transfer robot for putting in and out any one of workpieces with respect to each of the stockers. The transfer robot comprises a machine base, at least one hand for holding any one of the workpieces, a hand moving mechanism for moving the hand horizontally reciprocally at least in an X direction perpendicular to the Y direction, a first arm, a second arm, and a driving mechanism. The first arm has a base end and a free end. The base end of the first arm is connected to the machine base via a first connecting portion having an axis extending in the X direction, and the first arm is rotatable about the axis of the first connecting portion for allowing the free end to pass under the first connecting portion. The second arm also has a base end and a free end. The free end of the second arm is connected to the hand moving mechanism via a second connecting portion having an axis extending in the X direction. The driving mechanism causes the first arm to rotate about the axis of the first connecting portion while also rotating the hand moving mechanism about the axis of the second connecting portion. The transfer robot further includes an intermediate arm mechanism connected to the free end of the first arm via a third connecting portion having an axis extending in the X direction. The intermediate arm mechanism is also connected to the base end of the second arm via a fourth connecting portion having an axis extending in the X direction. The driving mechanism causes the intermediate arm mechanism to rotate about the axis of the third connecting portion while also causing the second arm to rotate about the axis of the fourth connecting portion.

The machine base may be fixed on a floor. Alternatively, the machine base may be movably supported on a movable support.

Other features and advantages of the present invention will become clearer from the detailed description given below with reference to the accompanying drawings.

BRIEF DESCRIPTION OF THE DRAWINGS

FIGS. 7a–7e illustrate different postures of the transfer robot shown in FIG. 1.

DETAILED DESCRIPTION OF THE PREFERRED EMBODIMENTS

Preferred embodiments of the present invention will be described below in detail with reference to the accompanying drawings.

FIGS. 1–6 illustrate a transfer robot according to a first embodiment of the present invention. In this embodiment, a predetermined direction in a generally horizontal plane is defined as "X direction", whereas a direction perpendicular to the X direction in a generally horizontal plane is defined as "Y direction". Further, the vertical direction is defined as "Z direction".

Figure 1:
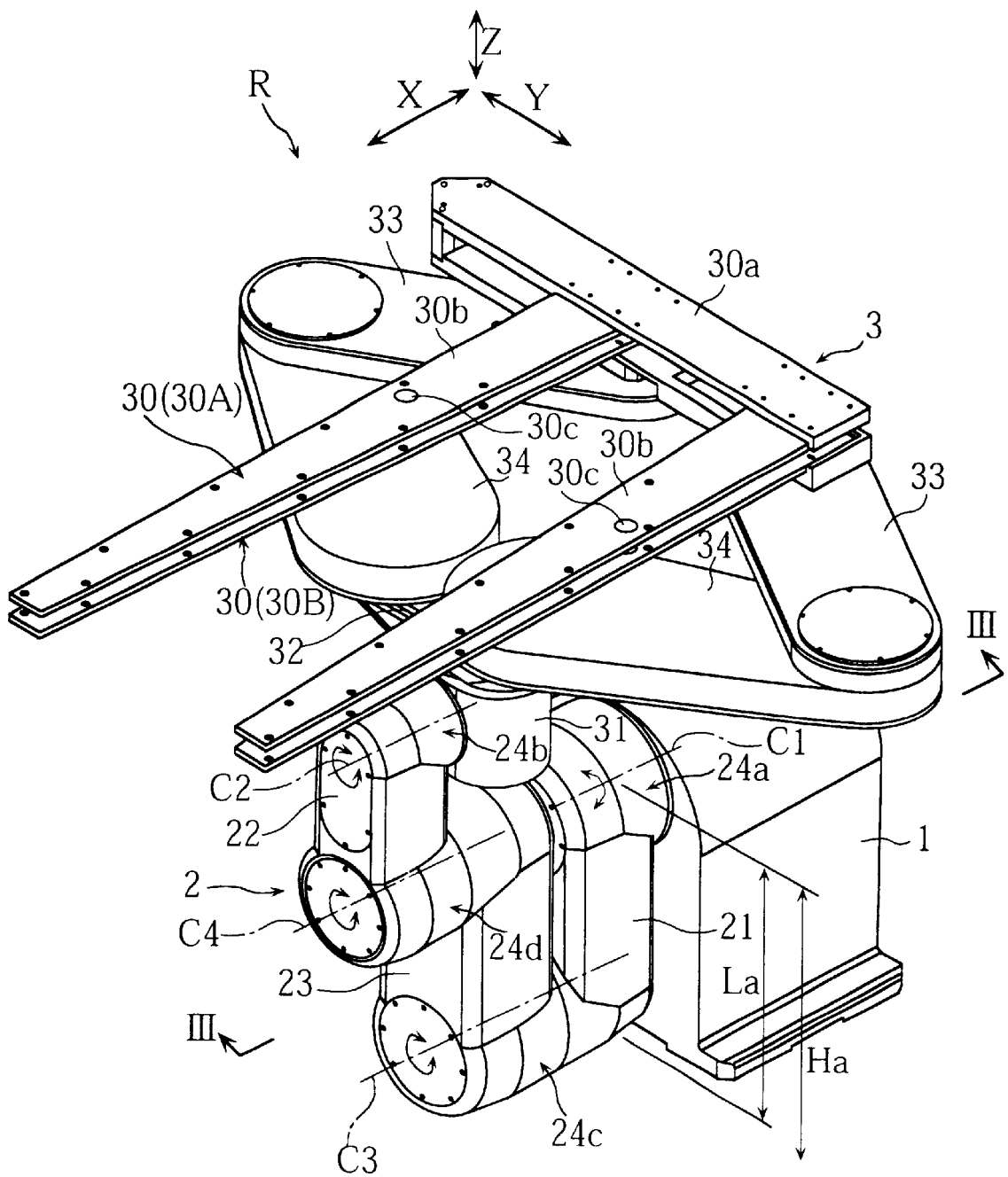
FIG. 1 is a perspective view showing a transfer robot according to a first embodiment of the present invention.
Figure 2:
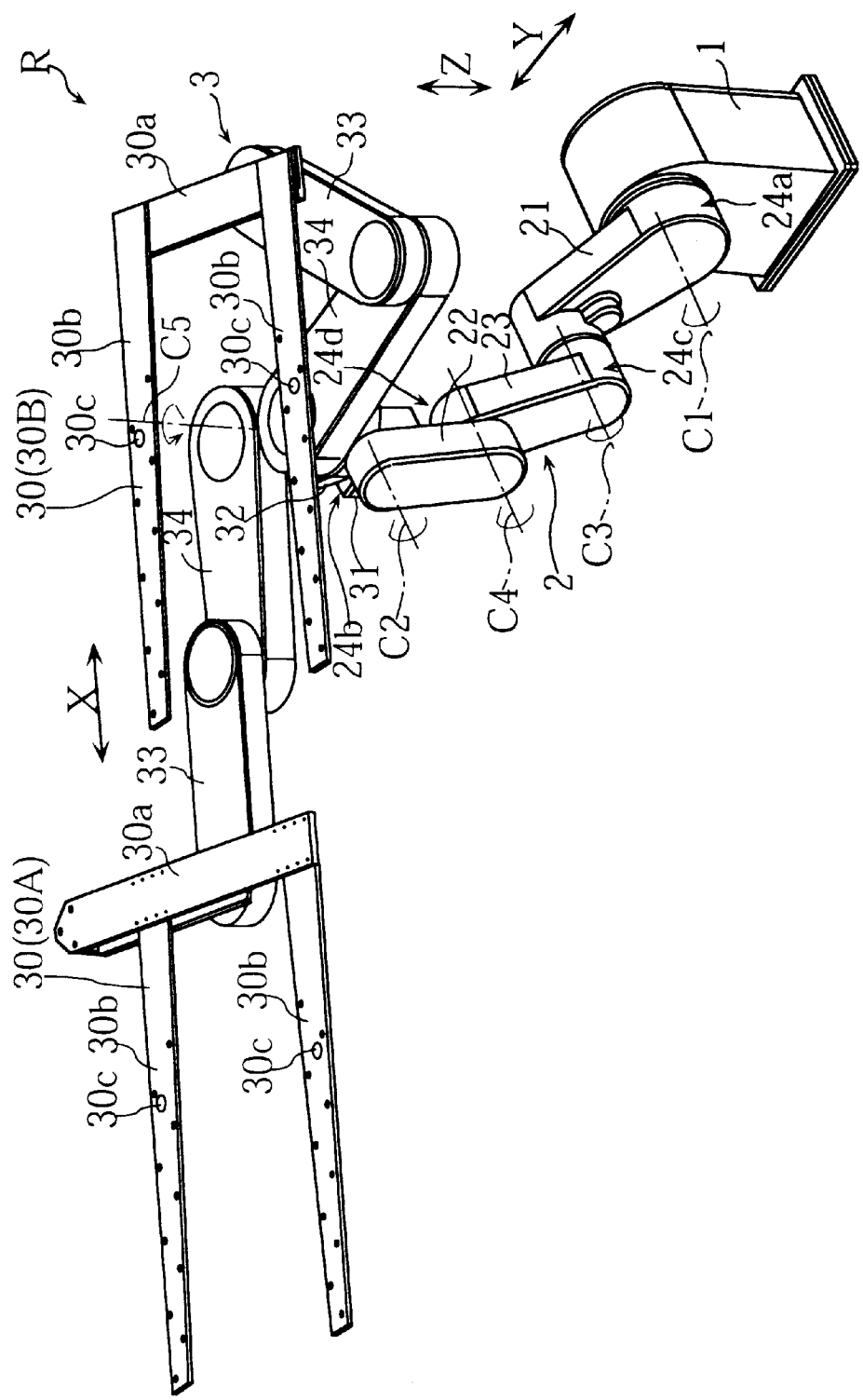
FIG. 2 is a perspective view illustrating the operation of the transfer robot shown in FIG. 1.

As clearly shown in FIGS. 1 and 2, a transfer robot R in this embodiment comprises a machine base 1, a link mechanism 2, and a hand moving mechanism 3 having two hands 30 (30A, 30B) and an intermediate base member 31 connected to the link mechanism 2.

The machine base 1 is in the form of a box having a predetermined height and may be fixed on a floor for example. However, as will be described later, the machine base 1 may be arranged movably in the Y direction.

The link mechanism 2 includes a first arm 21, a second arm 22 and an intermediate arm 23. The link mechanism 2 further includes a first through a fourth connecting portions 24a–24d having respective central axes C1–C4 extending in the X direction.

The first arm 21 has a base end connected laterally to an upper portion of the machine base 1 via the first connecting portion 24a. The first arm 21 also has a free end. The first arm 21 is rotatable about the axis C1. The length La between the axis C1 and the free end of the first arm 21 is smaller than the height Ha of the axis C1 from the floor surface. Therefore, the first arm 21 is rotatable about the axis C1 through 360°.

The intermediate arm 23 may be generally identical in length to the first arm 21. The intermediate arm 23 has a base end connected to the free end of the first arm 21 via the third connecting portion 24c and is rotatable about the axis C3 relative to the first arm 21. The intermediate arm 23 further has a free end opposite to the base end.

The second arm 22 is smaller in length than the first arm 21 and the intermediate arm 23. The second arm 22 has a base end connected to the free end of the intermediate arm 23 via the fourth connecting portion 24d for rotation about the axis C4 relative to the intermediate arm 23. The second arm 22 also has a free end connected to the intermediate base member 31 of the hand moving mechanism 3 via the second connecting portion 24b. Thus, the hand moving mechanism 3 is rotatable about the axis C2 relative to the second arm 22.

Figure 3:
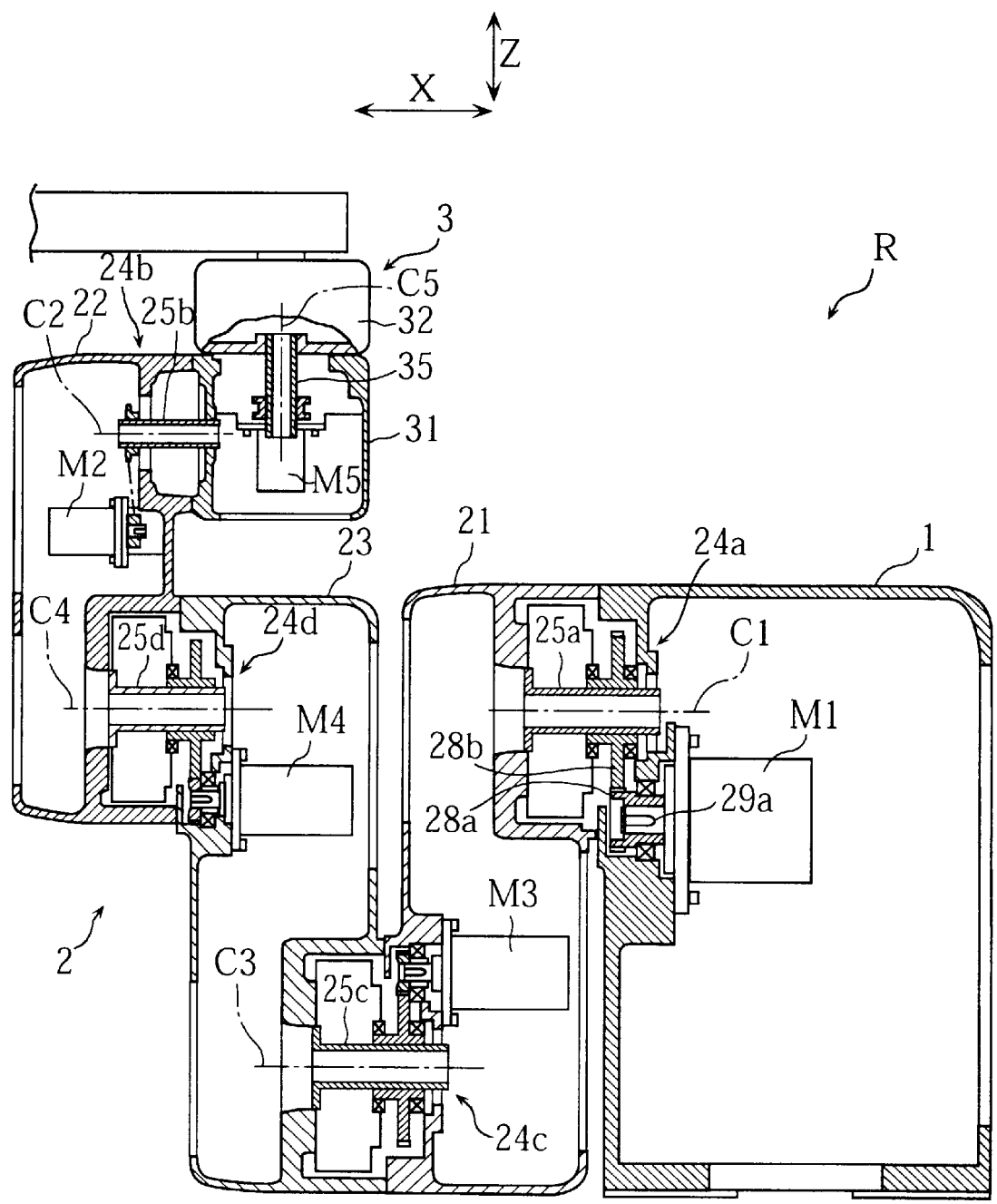
FIG. 3 is a sectional view taken along lines III—III in FIG. 1.

As clearly shown in FIG. 3, the machine base 1 as well as the arms 21–23 are hollow. Each of the arms 21–23 and the machine base 1 incorporates a driving mechanism for operating the link mechanism 2. Specifically, the first connecting portion 24a includes a sleeve 25a, which is rotatable about the axis C1, for connecting the machine base 1 to the first arm 21. The machine base 1 accommodates a motor M1 having a driving shaft 29a. The rotational force of the driving shaft 29a is transmitted via gears 28a, 28b to the sleeve 25a, thereby rotating the first arm 21 about the axis C1. The motor M1 may be a servo motor provided with a brake (not shown). This may hold for motors M2 through M6, which will be described later.

Similarly to the first connecting portion 24a, the second through the fourth connecting portions 24b, 24c, 24d include sleeves 25b, 25c, 25d, respectively, each of which is rotatable about a corresponding axis C2, C3, C4 and connects the relevant two members for rotation relative to each other. The arms 21–23 accommodates motors M3, M2, M4, respectively, each having a shaft for transmitting the rotational force to the corresponding sleeve 25b, 25c or 25d via a gear mechanism which may be optionally replaced with a combination of a timing belt and a timing pulley. As a result, the intermediate base member 31, the intermediate arm 23 and the second arm 22 rotate about the axes C2, C3, C4, respectively. These mechanisms including the motor M2 for rotating the intermediate base member 31 about the axis C2 is an example of driving means according to the present invention.

Cables (not shown) for supplying power to the motors M2–M4 (as well as those for motors M5, M6 to be described later) are arranged in the machine base 1, the first arm 21, the intermediate arm 23 and the second arm 22 while passing through the respective center holes of the sleeves 25a, 25c, 25d in the mentioned order. Part of the cables reaching the second arm 22 extends through the center hole of the sleeve 25b to be guided into the intermediate base member 31. With this arrangement, the cables are not exposed to the outside of the link mechanism 2 so that the appearance of the transfer robot R is not deteriorated. This arrangement further prevents the cables from undesirably twisting due to the rotation of the arms.

In addition to the intermediate base member 31 and the two hands 30 (30A, 30B), the hand moving mechanism 3 is provided with a movable member 32 connected on top of the intermediate base member 31, and two pairs of arms 33, 34 for operating the hands 30 (30A, 30B), respectively.

Figure 12:
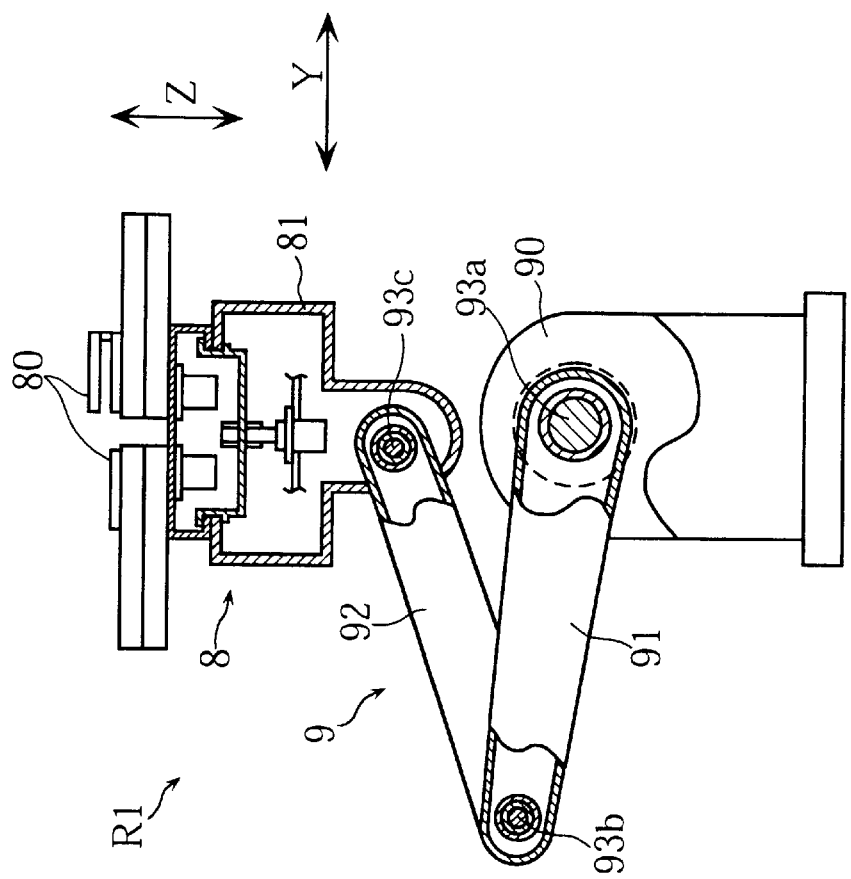
FIG. 12 illustrates a prior art transfer robot.
Figure 13:
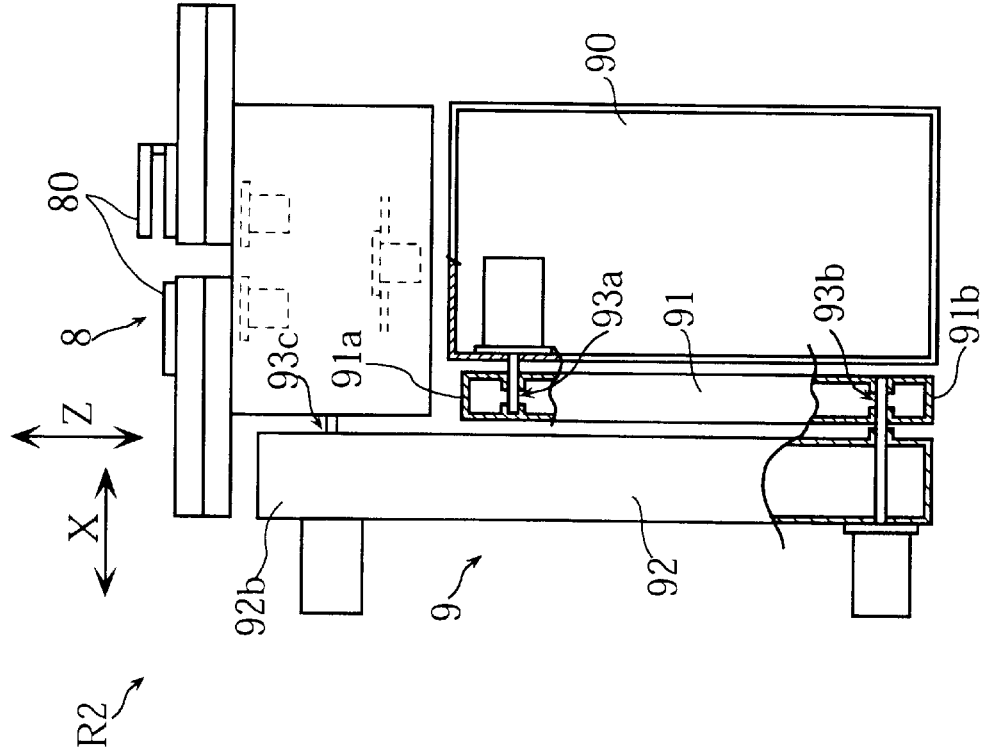
FIG. 13 illustrates another prior art transfer robot.

Each of the hands 30 (30A, 30B) may comprise a flat connecting bar 30a, and two finger bars 30b extending in the same direction from the connecting bar 30a in parallel to and at a predetermined spacing from each other. The hand is capable of holding a desired flat workpiece in substantially the same manner as already described with reference to FIG. 12 for example. The hand has an upper surface formed with a predetermined number of holes 30c for sucking the workpiece due to the negative pressure generated by a non-illustrated vacuum pump or blower. The connecting bar 30a of the hand 30A is connected to one end of a corresponding arm 33, whereas the connecting bar 30a of the other hand 30B is connected to one end of the other corresponding arm 33. As shown in FIG. 1, the two hands 30A, 30B are attached to the respective arms 33 at different heights so that they do not interfere with each other.

Upon operation of the link mechanism 2 incorporating the two pairs of arms 33, 34, the hands 30 (30A, 30B) are movable linearly reciprocally in the X direction independently of each other. A drive mechanism for moving the hands 30 linearly reciprocally independently of each other is known, and the present invention utilizes such a known drive mechanism.

Figure 4:
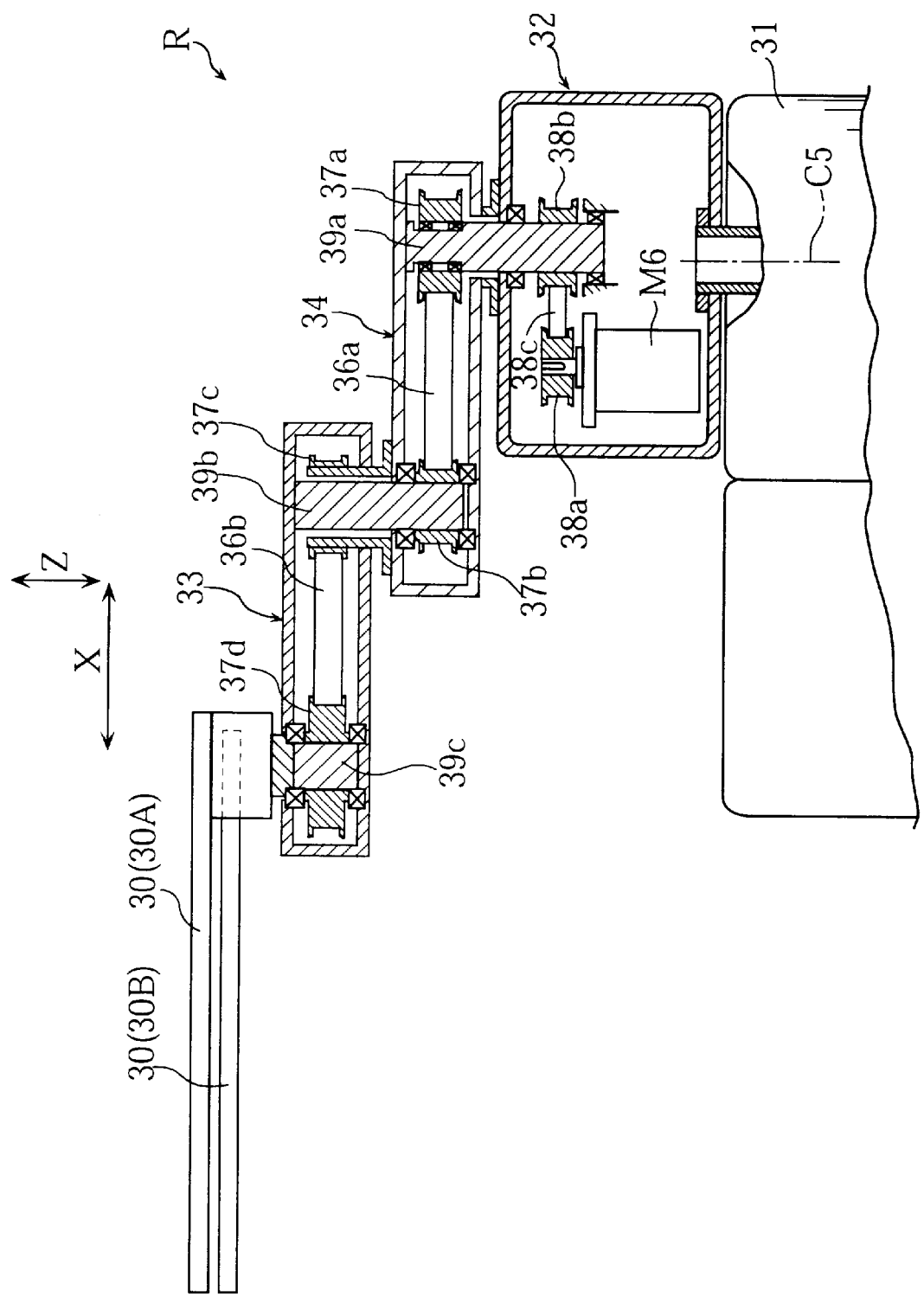
FIG. 4 is a schematic sectional view showing a hand driving mechanism of the transfer robot shown in FIG. 1.
Figure 5:
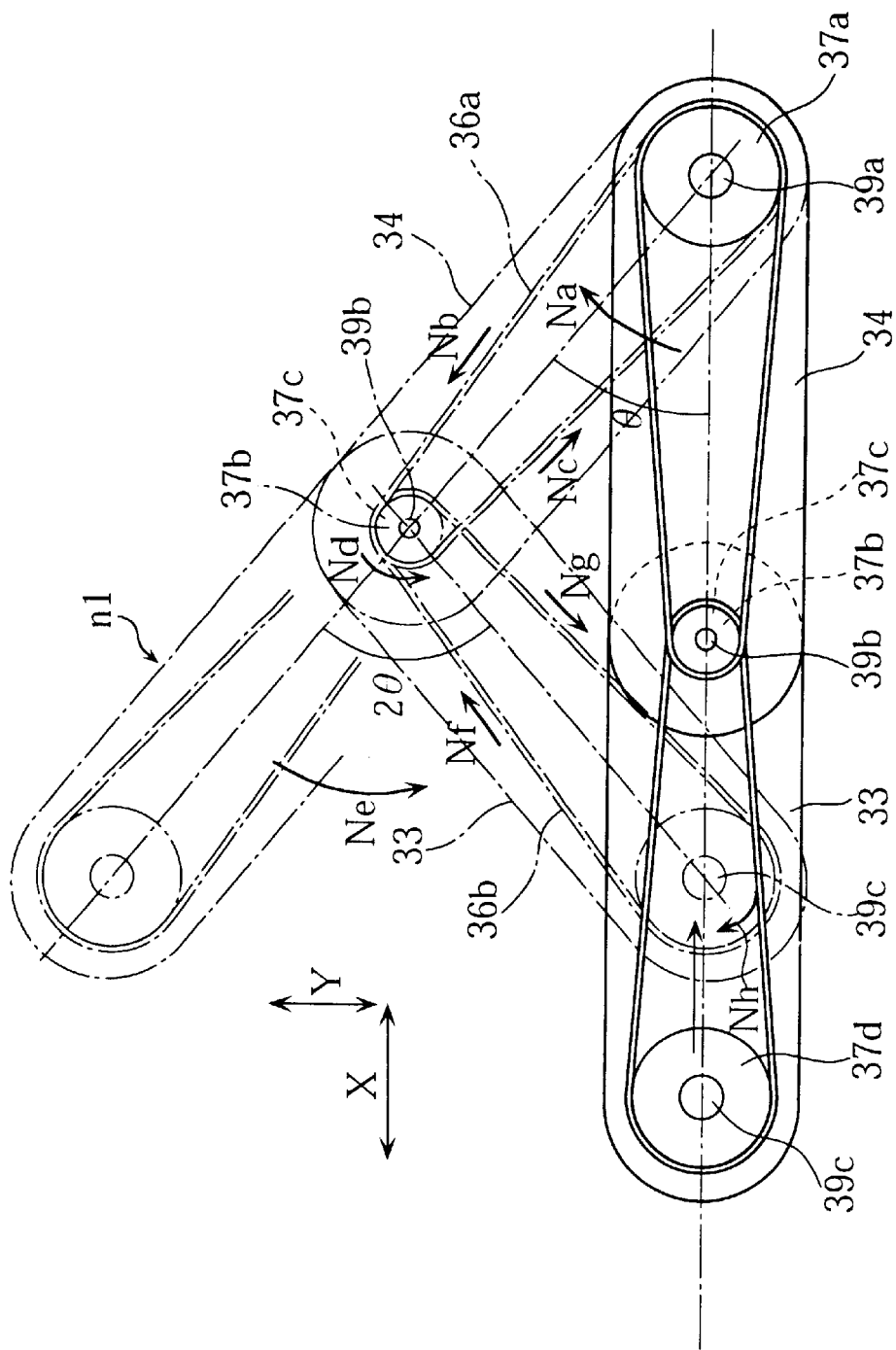
FIG. 5 illustrates the operation of the hand driving mechanism of the transfer robot shown in FIG. 1.

Specifically, as shown in FIG. 4, each of the arms 34 has a base end and a free end. The arm 34 is connected at the base end to the movable member 32 via a shaft 39a for rotation with the shaft 39a. The movable member 32 includes a motor M6 having a driving shaft which is associated with the shaft 39a via pulleys 38a, 38b and a belt 38c. Therefore, the shaft 39a is rotated by the motor M6.

Each of the arms 33 also has a base end and a free end. The arm 33 is connected at the base end to the free end of the corresponding arm 34 via a shaft 39b for rotation with the shaft 39b. The shafts 39a, 39b are provided with pulleys 37a, 37b, respectively, around which a belt 36a is wound. Thus, the shaft 39b rotates with the pulley 37a.

The connecting bar 30a of each hand 30 is connected to the free end of the corresponding arm 33 via a shaft 39c for rotation with the shaft 39c relative to the arm 33. The shafts 39b, 39c are provided with pulleys 37c, 37d, respectively, around which a belt 36b is wound. Thus, the shaft 39c rotates with the pulley 37c. Each of the pulleys 37b, 37c has a diameter which is half the diameter of each of the pulleys 37a, 37d.

The hand 30 moves linearly reciprocally in the following manner. The arms 33, 34 are initially aligned with each other, as depicted by the solid lines in FIG. 5. When the arms 33, 34 rotate in the arrow Na direction through an angle θ, the arm 33 is expected to move to a position indicated by reference sign n1 if the shaft 39b does not rotate relative to the arm 34. Actually, however, when the arm 34 rotates, the belt 36a moves in the arrow Nb-Nc direction, thereby rotating the pulley 37b and the shaft 39b in the arrow Nd direction. Therefore, the arm 33 rotates in the arrow Ne direction due to the rotation of the shaft 39b. Since the diameter of the pulley 37b is half the diameter of the pulley 37a, the rotational amount of the arm 33 is twice the rotational amount of the pulley 37a. Therefore, the rotational angle of the arm 33 in the arrow Ne direction becomes 2θ. During this movement, the shaft 39c provided at the free end of the arm 33 moves along a straight line connecting the center of the shaft 39c at its initial position and the center of the shaft 39a. In this way, the hand 30 moves linearly reciprocally.

Further, during the above-described operation, the belt 36b moves in the arrow Nf-Ng direction, thereby rotating the pulley 37d and the shaft 39c in the arrow Nh direction by an amount half the rotational amount of the pulleys 37b, 37c. As a result, the hand 30 rotates relative to the arm 33 in the arrow Nh direction through the angle θ. Therefore, the initial orientation of the hand 30 is maintained.

As clearly shown in FIG. 3, the movable member 32 is rotatable relative to the intermediate base member 31 about a vertically extending axis C5. Specifically, the movable member 32 is connected to the intermediate base member 31 via a sleeve 35. The sleeve 35 rotates about the axis C5 due to the driving force of a motor M5 provided in the intermediate base member 31. When the movable member 32 rotates about the axis C5, the arms 33, 34 as well as the hands 30 rotate correspondingly. Therefore, each of the hands 30 is capable of moving reciprocally in a generally horizontal plane in various directions in addition to the X direction.

Next, the operation of the above-described transfer robot R will be described.

Figure 6:
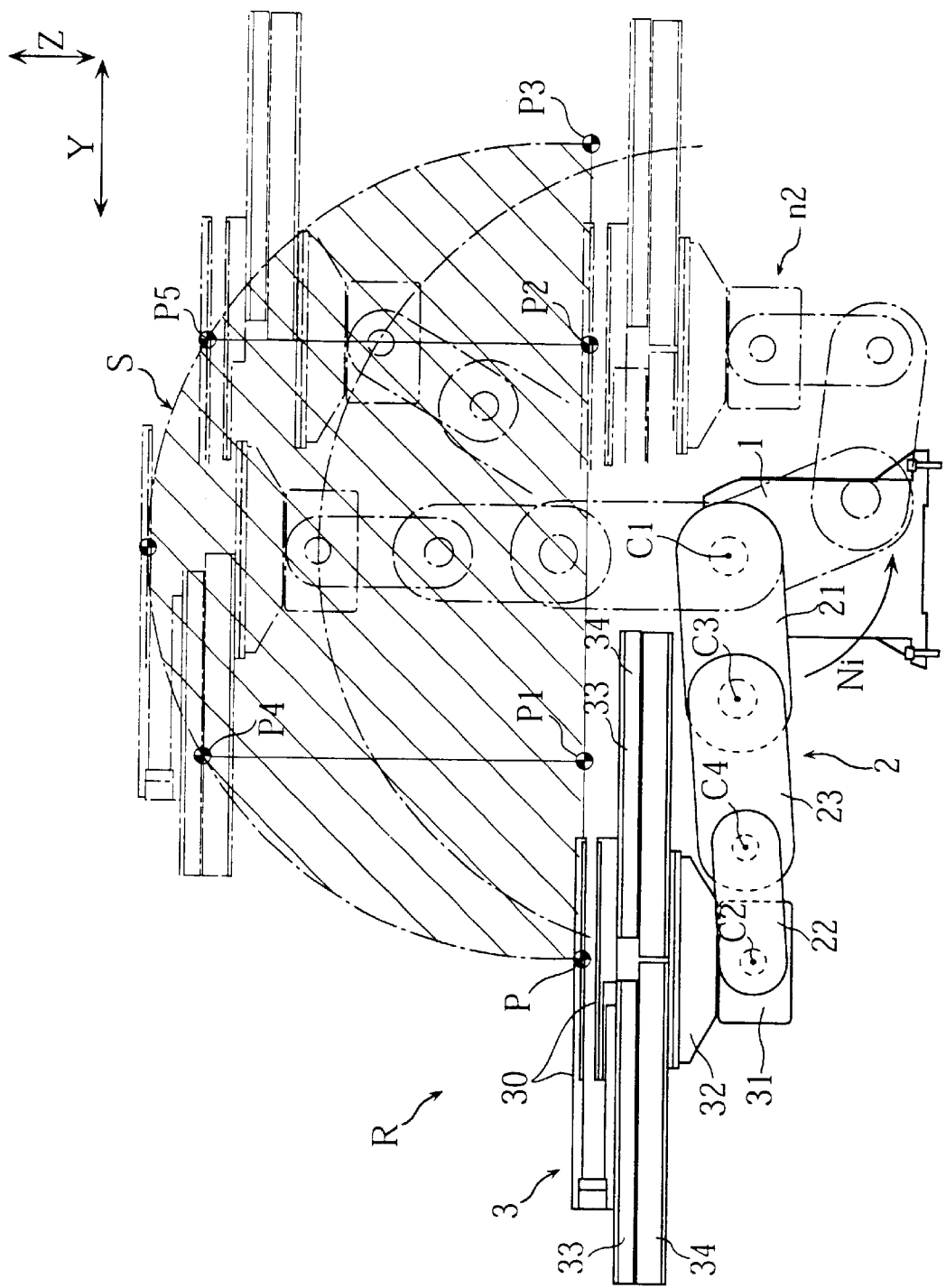
FIG. 6 illustrates the operation of the transfer robot shown in FIG. 1.

As shown in FIG. 6, in the transfer robot R, it is possible to move the hands 30 in the Y direction in addition to the Z direction by the rotation of the arms 21, 22, 23 about the respective axes C1, C3, C4. During the movement, it is possible to keep the posture of the hands 30 horizontal by rotating the intermediate base member 31 about the axis C2. It is also possible to keep the hands 30 in a posture other than the horizontal posture. For example, the hands 30 may assume a vertical posture. In this transfer robot R, it is possible to shift the respective centers P of the hands 30 to a desired position at least in a semicircular area hatched in FIG. 6.

For instance, when the arms 21–23 are shifted from their respective initial positions indicated by solid lines in FIG. 6 to new positions indicated by reference sign n2, the first arm 21 may be so rotated that the free end thereof passes under the axis C1. This prevents the intermediate arm 23 and the second arm 22 from increasing in height during the movement. Therefore, it is possible to move the hands 30 in the Y direction without unduly increasing the height of the hands 30.

The operation of the robot R will be described below in more detail. The center of the hands 30 which are initially located as depicted by solid lines in FIG. 6 can be shifted from its initial position P to positions P1, P2, P3 shown in FIG. 6 by rotating the respective arms 21–23 through various angles as shown in FIGS. 7a–7e. In this embodiment, the respective lengths of the intermediate arm 23 and the second arm 22 are made equal to or smaller than that of the first arm 21. Therefore, when the first arm 21 is so rotated as to lower the free end thereof, whereas the intermediate arm 23 and the second arm 22 are so rotated as to extend upward relative to the free end of the first arm 21, the position of the axis C2 becomes relatively low. This is advantageous for reducing the minimum height of the hands 30 moving in the Y direction.

Figure 11:
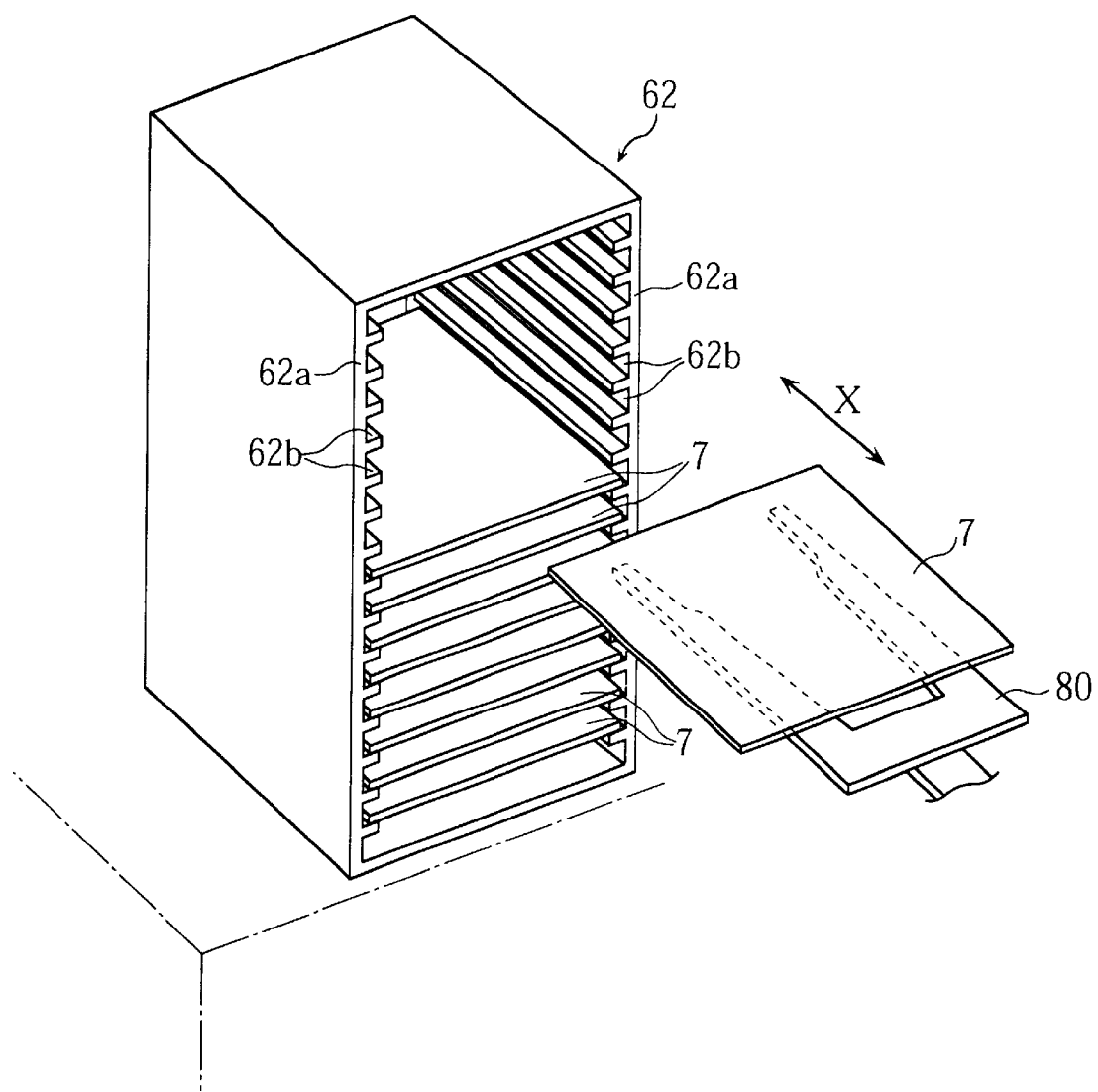
FIG. 11 is a perspective view showing the operation of putting in and out a workpiece with respect to a stocker using a transfer robot.

As described above, the link mechanism 2 of the present invention is advantageous for reducing the minimum height of the hands 30. On the other hand, it is also possible to raise the hands 30 to a considerably high position by rotating the respective arms 21–23 so as to extend upwardly. Therefore, as shown in FIG. 11, when the transfer robot R is used for putting in and out workpieces with respect to a stocker 62 having a relatively large height, it is possible to put in and out the workpieces even with respect to the lowest stage and the highest stage of the stocker 62. In this embodiment, each of the hands 30 is movable linearly in both the Y direction and the Z direction within a rectangular area defined by four corner points P1, P2, P4, P5 shown in FIG. 6.

Figure 8:
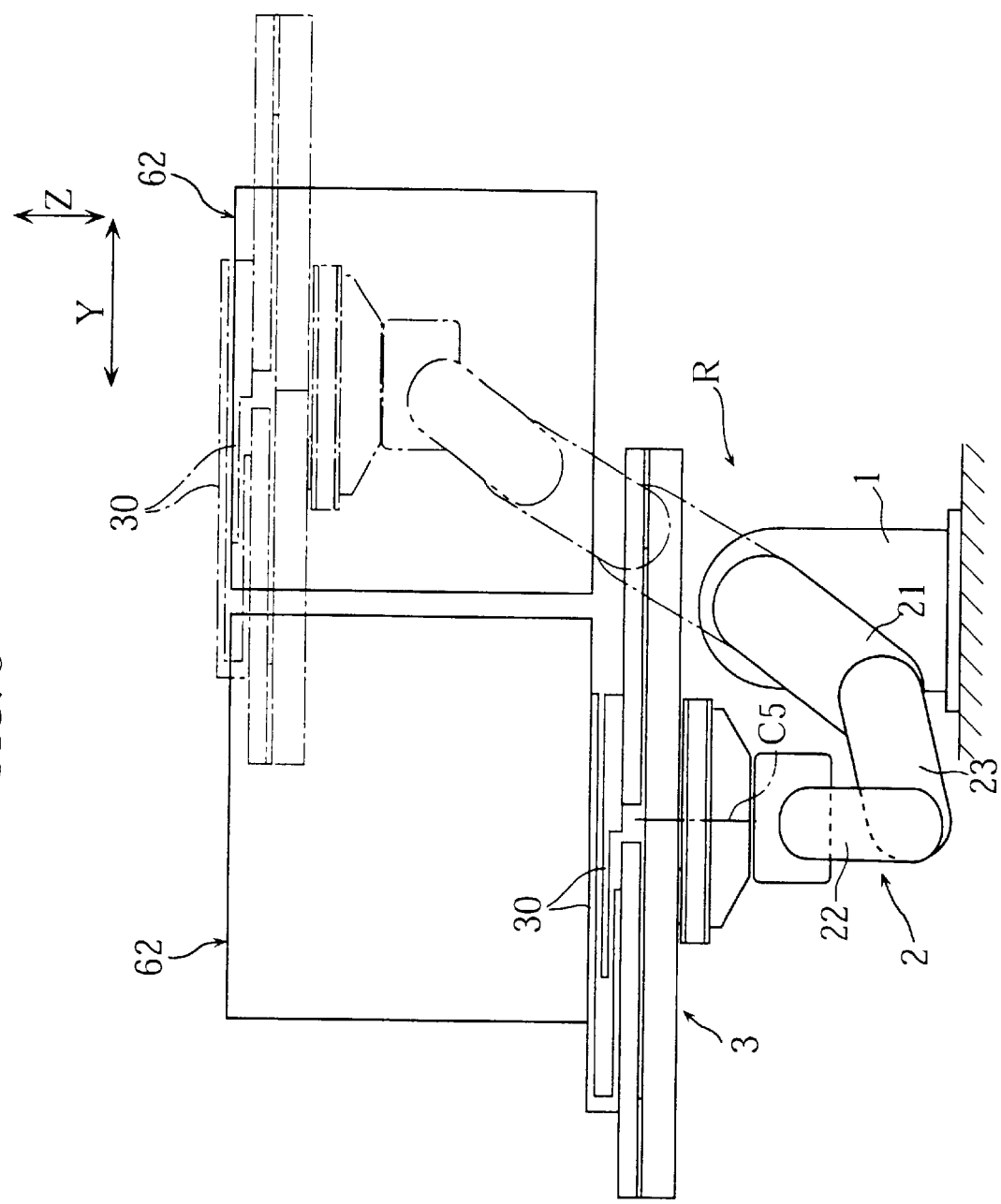
FIG. 8 illustrates a use example of the transfer robot shown in FIG. 1.

With the above-described transfer robot R, in the case where two stockers 62 for storing workpieces are aligned in the Y direction as shown in FIG. 8 for example, the link mechanism 2 can operate to locate the hands 30 in front of each of the stockers 62 with the machine base 1 fixed on the floor. Therefore, it is possible to efficiently put in and out the workpieces with respect to each of the stockers 62. The movement of each of the hands 30 in the Z direction and the Y direction can be performed simultaneously and in combination. At that time, each of the hands 30 can be caused to rotate horizontally about the axis C5 for enhancing the operation efficiency. Further, it is also possible to individually move the two hands 30 reciprocally, which also contributes to an enhancement of the operation efficiency.

Figure 9:
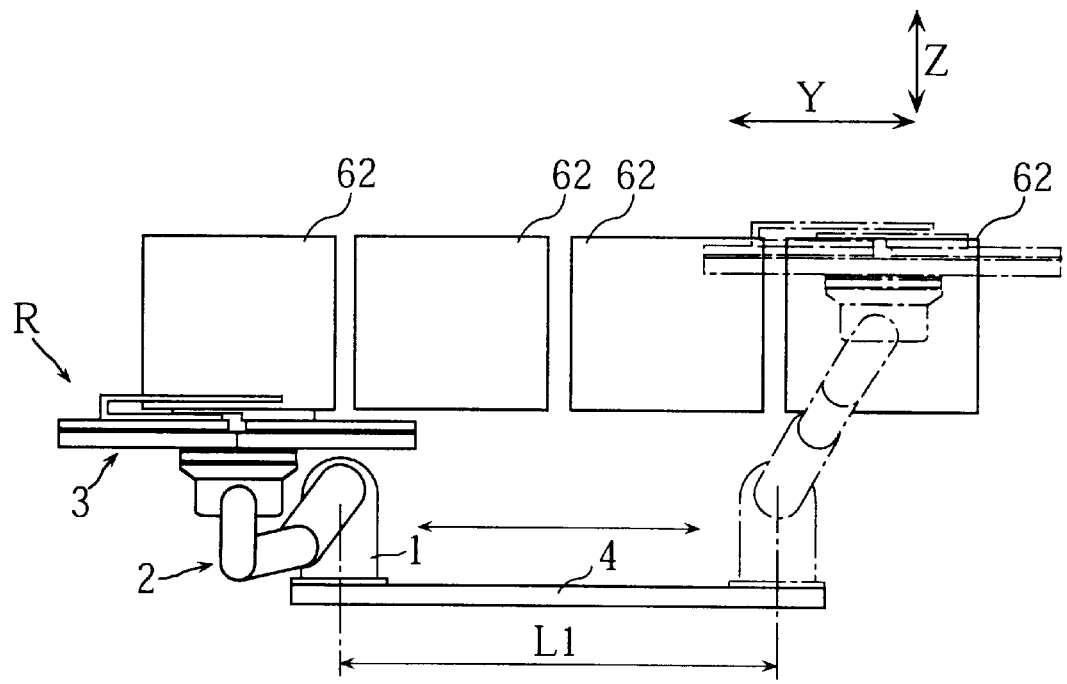
FIG. 9 illustrates another use example of the transfer robot shown in FIG. 1.

In the case where a relatively large number of stockers 62 are aligned in the Y direction as shown in FIG. 9, a movable support 4 may be utilized. Specifically, the machine base 1 may be disposed on the movable support 4 for moving the entire transfer robot R in the Y direction. Since the hands 30 of the transfer robot R are also movable in the Y direction, the moving stroke L1 of the entire transfer robot R can be rendered as small as possible. Moreover, since it is possible to move the hands 30 in the Y direction while simultaneously moving the entire robot R in the Y direction, the operation speed of the transfer robot R can be increased.

Figure 10:
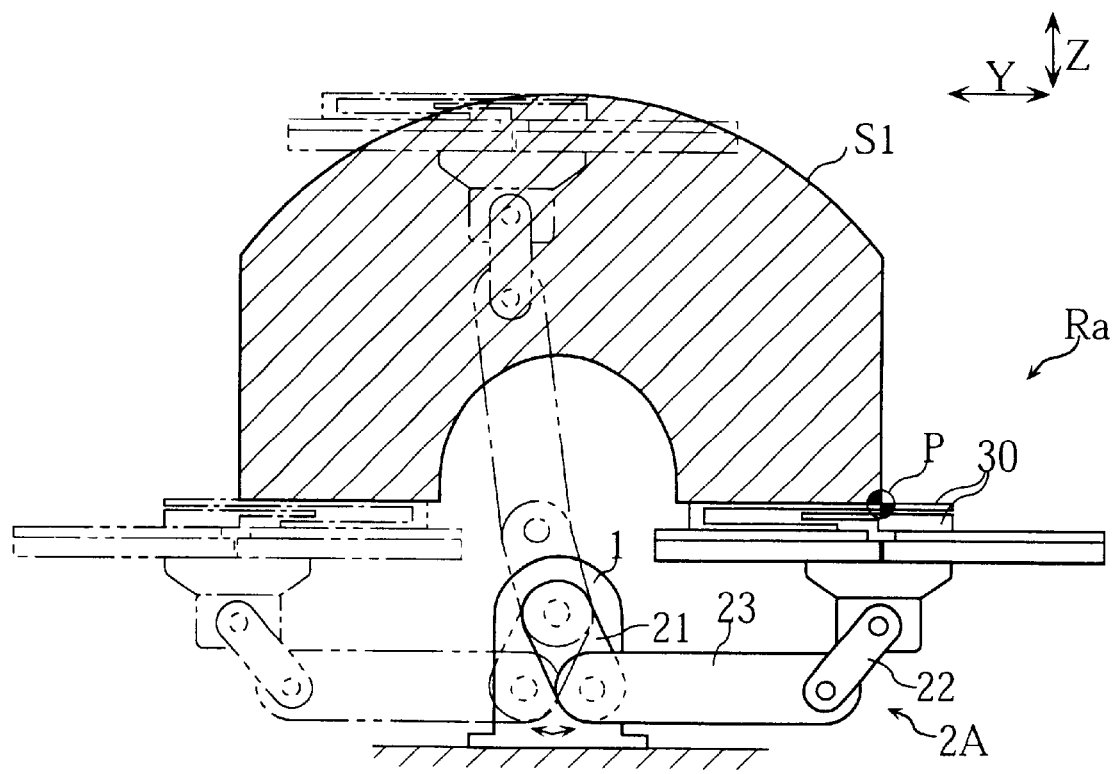
FIG. 10 illustrates a transfer robot according to another embodiment of the present invention.

FIG. 10 illustrates a transfer robot Ra according to another embodiment of the present invention. In this figure, the elements which are identical or similar to those of the first embodiment are designated by the same reference signs as those used for the first embodiment.

Although the structure of the transfer robot Ra is basically the same as that of the transfer robot R of the first embodiment, the transfer robot Ra of this embodiment differs from that of the first embodiment in that the intermediate arm 23 of the link mechanism 2A is made longer than the first arm 21.

With such a structure, in the process of shifting the link mechanism 2A from its initial posture depicted by solid lines to other postures depicted by phantom lines in FIG. 10, the center P of the hands 30 can move as desired at least within an area S1 hatched in the figure. By making the intermediate arm 23 longer than that of the transfer robot R shown in FIG. 6, it is possible to increase the maximum height as well as the movable range of the hands 30 in the Z direction. In this arrangement, however, the hands 30 cannot move horizontally in a particular area located generally directly above the intermediate base member 1. In the present invention, instead of the intermediate arm 23, the second arm 22 may be made longer than the first arm 21. Also in such a case, the same advantages as described above can be obtained.

The specific structure of each of the components of the transfer robot according to the present invention may be modified in various ways.

For example, a plurality of intermediate arms may be used for connecting the first arm and the second arm. Moreover, instead of the above-described mechanism, other various mechanisms may be utilized for moving the hands 30 reciprocally in the X direction.

The transfer robot of the present invention may be utilized in a liquid crystal panel manufacturing equipment for transferring a substrate of a liquid crystal panel for example. Further, the transfer robot may be utilized for transferring a semiconductor wafer for example, and the usage thereof is not limitative. Therefore, the specific structure of the hand may be modified in various ways in accordance with the kind of workpieces. For instance, the hand may be so structured as to carry a workpiece as disposed thereon, to mechanically clamp a workpiece, or to attract a workpiece due to negative pressure, magnetic force or other physical force. A plurality of hands need not necessarily be provided, and the present invention requires at least one hand.

The present invention being thus described, it is apparent that the same may be varied in many ways. Such variations should not be regarded as a departure from the spirit and scope of the present invention, and all such modifications as would be obvious to those skilled in the art are intended to be included within the scope of the following claims.

What is claimed is:

1. A transfer robot comprising:

a machine base having a top;

at least one hand for holding a workpiece;

an intermediate base member for supporting the hand, the intermediate base member having a bottom;

a hand moving mechanism for moving the hand horizontally reciprocally at least in an X direction;

a first arm having a base end and a free end, the base end being connected to the machine base via a first connecting portion having a first axis extending in the X direction, the first arm being rotatable about the axis of the first connecting portion for allowing the free end to pass under the first connecting portion, the first axis being positioned at a predetermined height above a floor surface;

a second arm having a base end and a free end, the free end of the second arm being connected to the intermediate base member via a second connecting portion having a second axis extending in the X direction; and a driving mechanism for rotating the first arm about the first axis of the first connecting portion while also rotating the hand moving mechanism about the second axis of the second connecting portion;

wherein the transfer robot further includes an intermediate arm having a base end connected to the free end of the first arm via a third connecting portion having a third axis extending in the X direction, the intermediate arm also connected to the base end of the second arm via a fourth connecting portion having a fourth axis extending in the X direction, the driving mechanism causing the intermediate arm to rotate about the third axis of the third connecting portion while also causing the second arm to rotate about the fourth axis of the fourth connecting portion, a length between the free end of the first arm and the first axis is smaller than the height of the first axis, each of the intermediate arm and the second arm is no greater in length than the first arm, the intermediate arm and the second arm providing a combined length which is greater than the length of the first arm, and the intermediate base member is disposed entirely clear of the machine base in the X direction for movement to a position in which the bottom of the intermediate base member is located under the top of the machine base.

2. The transfer robot according to claim 1, wherein the driving mechanism comprises a first motor for rotating the first arm about the first axis of the first connecting portion, a second motor for rotating the hand moving mechanism about the second axis of the second connecting portion, a third motor for rotating the intermediate arm about the third axis of the third connecting portion, and a fourth motor for rotating the second arm about the fourth axis of the fourth connecting portion.

3. The transfer robot according to claim 1, wherein the hand moving mechanism moves a plurality of hands at least in the X direction independently of each other.

4. The transfer robot according to claim 3, wherein the plurality of hands differ from each other in height.

5. The transfer robot according to claim 1, wherein the hand moving mechanism is rotatable about a vertical axis for making the hand movable reciprocally in a generally horizontal plane in any direction other than the X direction.

6. A robotic transfer system comprising:

a plurality of stockers aligned in a Y direction, each of the stockers storing a plurality of workpieces in multiple stages; and a transfer robot for putting in and out any one of workpieces with respect to each of the stockers;

wherein the transfer robot comprises:

a machine base having a top;

at least one hand for holding a workpiece;

an intermediate base member for supporting the hand, the intermediate base member having a bottom;

a hand moving mechanism for moving the hand horizontally reciprocally at least in an X direction;

a first arm having a base end and a free end, the base end being connected to the machine base via a first connecting portion having a first axis extending in the X direction, the first arm being rotatable about the axis of the first connecting portion for allowing the free end to pass under the first connecting portion, the first axis being positioned at a predetermined height above a floor surface;

a second arm having a base end and a free end, the free end of the second arm being connected to the intermediate base member via a second connecting portion having a second axis extending in the X direction; and a driving mechanism for rotating the first arm about the first axis of the first connecting portion while also rotating the hand moving mechanism about the second axis of the second connecting portion;

wherein the transfer robot further includes an intermediate arm having a base end connected to the free end of the first arm via a third connecting portion having a third axis extending in the X direction, the intermediate arm also connected to the base end of the second arm via a fourth connecting portion having a fourth axis extending in the X direction, the driving mechanism causing the intermediate arm to rotate about the third axis of the third connecting portion while also causing the second arm to rotate about the fourth axis of the fourth connecting portion, a length between the free end of the first arm and the first axis is smaller than the height of the first axis, each of the intermediate arm and the second arm is no greater in length than the first arm, the intermediate arm and the second arm providing a combined length which is greater than the length of the first arm, and the intermediate base member is disposed entirely clear of the machine base in the X direction for movement to a position in which the bottom of the intermediate base member is located under the top of the machine base.

7. The robotic transfer system according to claim 6, wherein the machine base is fixed on a floor.

8. The robotic transfer system according to claim 6, wherein the machine base is movably supported on a movable support.

9. A transfer robot comprising:

a machine base;

at least one hand for holding a workpiece;

a hand moving mechanism for moving the hand horizontally reciprocally at least in an X direction;

a first arm having a base end and a free end, the base end being connected to the machine base via a first connecting portion having a first hollow sleeve extending in the X direction, the first arm being rotatable about the first sleeve for allowing the free end to pass under the first connecting portion;

a second arm having a base end and a free end, the free end of the second arm being connected to the hand moving mechanism via a second connecting portion having an a second sleeve extending in the X direction; and a driving mechanism for rotating the first arm about the first sleeve while also rotating the hand moving mechanism about the second sleeve;

wherein the transfer robot further includes an intermediate arm connected to the free end of the first arm via a third connecting portion having a third sleeve extending in the X direction, the intermediate arm being also connected to the base end of the second arm via a fourth connecting portion having an a fourth sleeve extending in the X direction, the driving mechanism causing the intermediate arm to rotate about the third sleeve while also causing the second arm to rotate about the fourth sleeve, the driving mechanism comprises a first motor for rotating the first arm about the first sleeve, a second motor for rotating the hand moving mechanism about the second sleeve, a third motor for rotating the intermediate arm about the third sleeve, and a fourth motor for rotating the second arm about the fourth sleeve, and each of the first through fourth motors has a respective drive shaft which positionally deviates from a corresponding one of the first through fourth sleeves.

* * * * *